United States Patent
Seo

[11] Patent Number: 6,063,691
[45] Date of Patent: May 16, 2000

[54] SHALLOW TRENCH ISOLATION (STI) FABRICATION METHOD FOR SEMICONDUCTOR DEVICE

[75] Inventor: Su Jin Seo, Cheongju, Rep. of Korea

[73] Assignee: LG Semicon Co., Ltd., Cheongju, Rep. of Korea

[21] Appl. No.: 09/095,927

[22] Filed: Jun. 12, 1998

[30] Foreign Application Priority Data

Dec. 29, 1997 [KR] Rep. of Korea ............... 97-76818 U

[51] Int. Cl.[7] .................................................. H01L 21/76
[52] U.S. Cl. .................. 438/431; 438/423; 438/424; 438/432; 438/524; 438/532
[58] Field of Search ............................... 438/423, 424, 438/430, 431, 432

[56] References Cited

U.S. PATENT DOCUMENTS

| | | | |
|---|---|---|---|
| 5,190,889 | 3/1993 | Poon et al. | 437/67 |
| 5,387,540 | 2/1995 | Poon et al. | 437/67 |
| 5,786,263 | 7/1998 | Perera | 438/431 |

*Primary Examiner*—David Nelms
*Assistant Examiner*—Phuc Dang
*Attorney, Agent, or Firm*—Fleshner & Kim, LLP

[57] ABSTRACT

An STI fabrication method for a semiconductor device is disclosed, which includes the steps of forming a trench on a semiconductor substrate, forming a conductive film on the trench, ion-implanting a germanium into the conductive film, and oxidizing the conductive film.

7 Claims, 4 Drawing Sheets

SHALLOW TRENCH ISOLATION (STI) FABRICATION METHOD FOR SEMICONDUCTOR DEVICE

BACKGROUND OF THE INVENTION

1. Field of the Invention

The present invention relates to an isolation for a semiconductor device, and in particular to an improved STI fabrication method for a semiconductor device.

2. Description of the Background Art

The shallow trench isolation (STI) for a known semiconductor device will now be explained with reference to the accompanying drawings.

As shown in FIG. 1A, a first oxide film 2 is formed on a semiconductor substrate 1, and a nitride film 3 is formed on the first oxide film 2. The thickness of the nitride 3 is about 2000 Å.

Next, as shown in FIG. 1B, a photoresist pattern 4 is formed on the nitride film 3, and the first oxide film 2 and the nitride film 3 are etched and patterned using the thusly formed photoresist pattern 4 as a mask. At this time, the upper etched portions of the first oxide film 2 and nitride film 3 on the semiconductor substrate 1 are exposed.

As shown in FIG. 1C, the exposed semiconductor substrate 1 is etched using the nitride film pattern 3a as a hard mask for thus forming a trench 5, and a second oxide film 6 is formed on the trench 5 to have a thickness which is the same as the thickness of the first oxide film 2. Thereafter, a third oxide film 7 is formed on the semiconductor substrate 1 including the first oxide film 2, the nitride film pattern 3a and the second oxide film 6 by a high density plasma chemical vapor deposition (HDP CVD) method. After that, the annealing process is processed with respect to the resultant structure. At this time, the trench 5 is filled with the third oxide film 7 (gapfill step).

As shown in FIG. 1D, the third oxide film 7 is etched by a chemical-mechanical polishing method (CMP). At this time, the nitride pattern 3a which serves as an etching stopper is partially etched.

As shown in FIG. 1E, the residual nitride film 3a and the first oxide film 2 are etched and removed, and the conventional STI fabrication method is completed.

However, the STI fabrication method for a known semiconductor device has a problem in that the STI is fabricated using an expensive semiconductor apparatus such as an HDP CVD apparatus and CMP, so that the fabrication cost is increased.

In addition, a predetermined defect may occur on the surface of the semiconductor substrate due to the stress of the thick nitride film when heat-treating the HDP CVD oxide film.

Furthermore, the oxide film of the corner of the trench may be etched beyond the surface height of the semiconductor substrate when etching the HDP CVD oxide film, so that the polysilicon deposited on the corner portion may not be etched after the polysilicon is deposited for thus causing a predetermined isolation therein.

SUMMARY OF THE INVENTION

Accordingly, it is an object of the present invention to provide a shallow trench isolation (STI) fabrication method for a semiconductor device which overcomes the aforementioned problems encountered in the background art.

It is another object of the present invention to provide an STI fabrication method for a semiconductor device which is implemented without using an expensive HDP CVD apparatus or a CMP apparatus.

It is another object of the present invention to provide an STI fabrication method for a semiconductor device which is capable of using an oxide film formed by oxidizing an impurity-doped conductive film as a gapfill member of a trench without using an HDP CVD oxide film.

It is another object of the present invention to provide an STI fabrication method for a semiconductor device which is capable of restricting an occurrence of a defect on the surface of the semiconductor substrate when heat-treating an oxide film by forming a nitride film having a thickness below minimum 500 Å.

To achieve the above objects, there is provided an STI fabrication method for a semiconductor device which includes forming a trench on a semiconductor substrate, forming a conductive film on the trench, ion-implanting a germanium into the conductive film, and oxidizing the conductive film.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The STI fabrication method for a semiconductor device according to the present invention will now be explained with reference to the accompanying drawings.

Figure 1A:
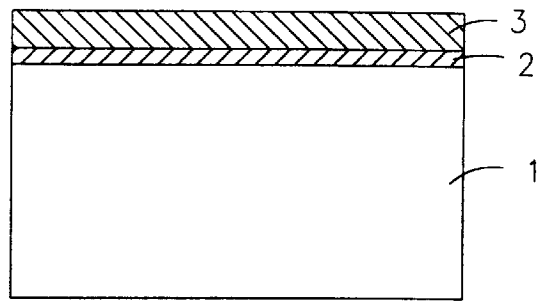
FIGS. 1A through 1E are cross-sectional views illustrating a shallow trench isolation (STI) fabrication method for a known semiconductor device.
Figure 1B:
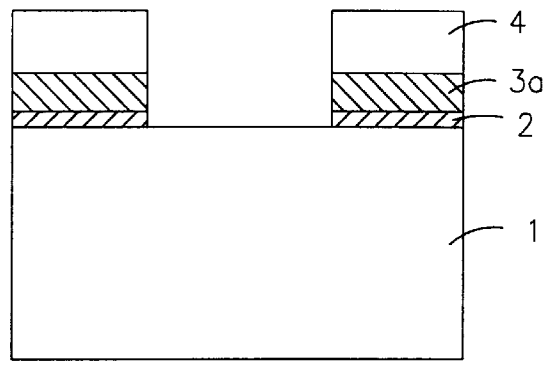
Figure 1C:
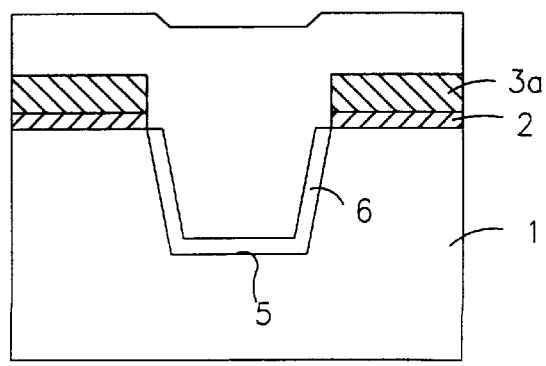
Figure 1D:
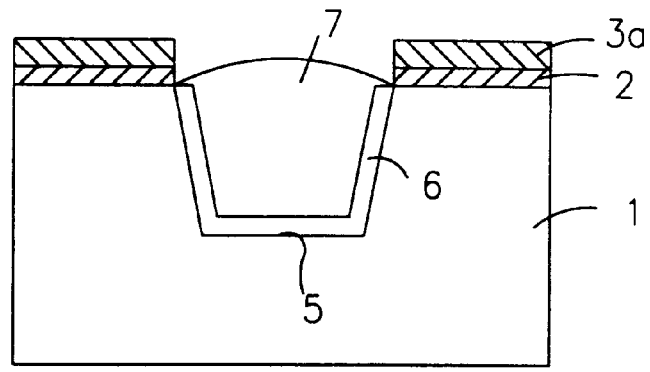
Figure 1E:
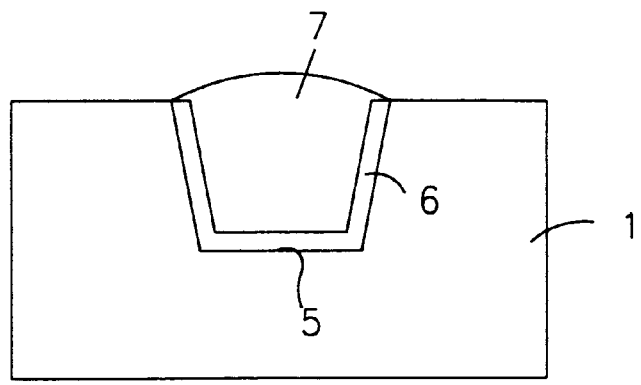
Figure 2A:
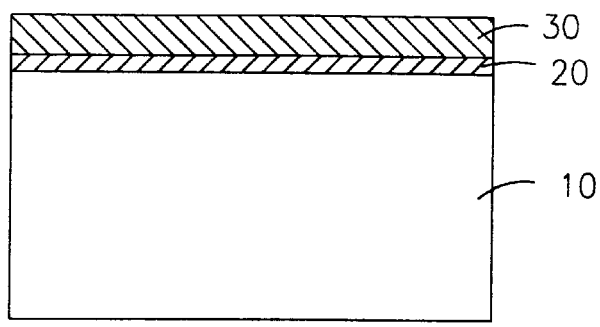
FIGS. 2A through 2E are cross-sectional views illustrating an STI fabrication method for a semiconductor device according to the present invention.

As shown in FIG. 2A, a first insulation film 20 is formed on a semiconductor substrate 10, and a nitride film 30 is formed thereon. At this time, the nitride film 30 has a thickness below minimum 500 Å.

Figure 2B:
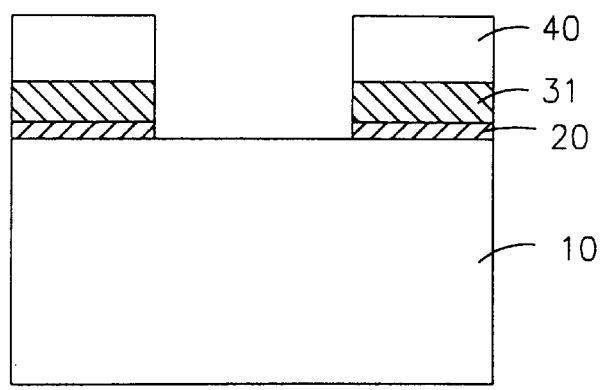

As shown in FIG. 2B, a photoresist pattern 40 is formed on the first insulation film 20, and the first insulation film 20 and the nitride film 30 are etched and patterned using the thusly formed photoresist film pattern 40 as a mask. At this time, the upper etched portion of the semiconductor substrate 10 is exposed. The photoresist film pattern 40 is etched and removed.

Figure 2C:
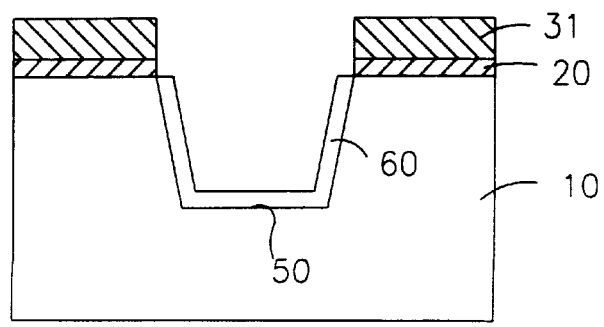

As shown in FIG. 2C, the exposed semiconductor substrate 10 is etched for thus forming a trench 50 using the nitride film pattern 31 as a hard mask, and a conductive p-poly Si film 60 is formed on the surface of the trench 50 by selectively and epitaxilly growing a B-doped conductive polysilicon to a thickness of 1000 Å. The above-described selective and epitaxial growth of the p-poly silicon is formed in such a manner that the semiconductor substrate 10 having the trench 50 is provided in a reactive container and HCL is provided thereinto. Thereafter, a DCS (Dichlorosilane, $SiH_2Cl_2$) is provided into the reactive container as a silicon source, and a diluted $B_2H_6$ borane) is provided thereinto as a p-type dopant. At this time, the HCL gas is used to delay the formation of Si atom and control the growth of the Si layer. As the conductive film 60, the n-poly Si film may be used which is formed by selectively and epitaxially growing the p-doped polysilicon (c-poly Si).

Figure 2D:
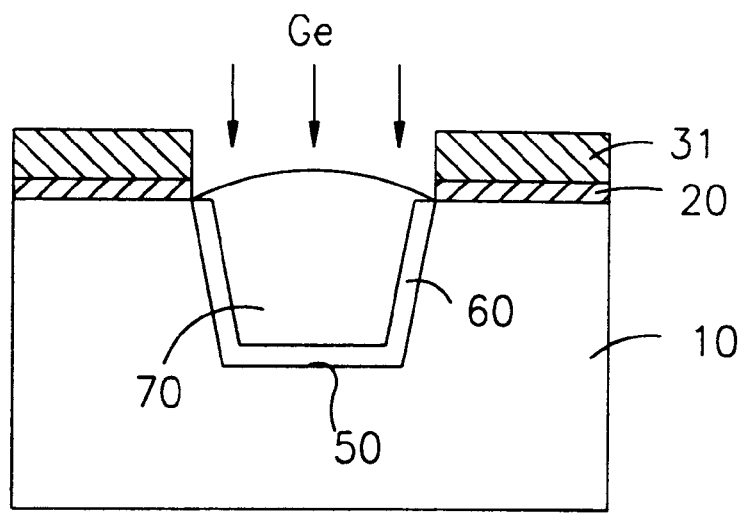

As shown in FIG. 2D, Ge (Germanium) is implanted into the p-poly Si film 60 by a tile ion implantation method in order to destroy the Si—Si connection of the p-poly Si film 60. Thereafter, the p-poly Si film 60 is oxidized under the oxygen environment for thus forming a p-poly Si oxide film 70.

Figure 2E:
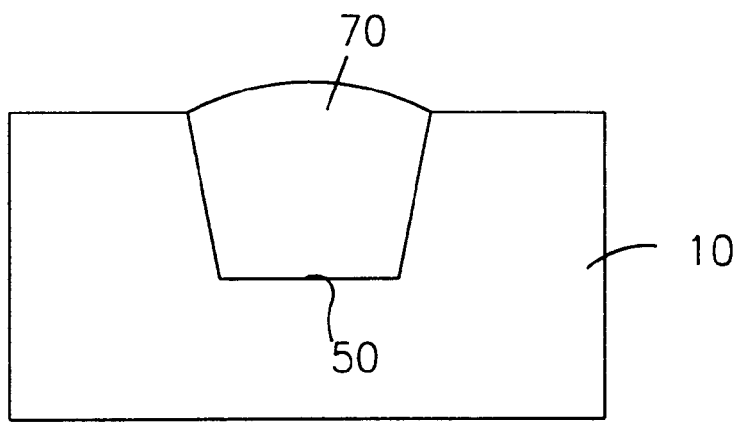

In addition, as shown in FIG. 2E, the nitride film pattern 31 and the first insulation film 20 formed on the semiconductor substrate 10 are etched and removed, so that the STI fabrication for the semiconductor device is finished.

As described above, in the present invention, it is possible to reduce the fabrication cost without using en expensive HDP CVD apparatus and CMP apparatus. In addition, the oxide film which is a gapfill member of the trench may be formed at low temperature, and the nitride film has a thickness below minimum 500 Å, so that it is possible to prevent a defect of the semiconductor substrate when performing an annealing process.

Although the preferred embodiment of the present invention have been disclosed for illustrative purposes, those skilled in the art will appreciate that various modifications, additions and substitutions are possible, without departing from the scope and spirit of the invention as recited in the accompanying claims.

What is claimed is:

1. A shallow trench isolation (STI) fabrication method, comprising the steps of:

forming a trench on a semiconductor substrate;

forming a conductive film on the trench;

ion-implanting a germanium into the conductive film; and oxidizing the conductive film.

2. The method of claim 1, wherein said trench formation step includes the steps of:

forming a first insulation film on the semiconductor substrate;

forming a nitride film on the first insulation film;

forming a photoresist film pattern on the nitride film;

etching and patterning the first insulation film and nitride film using the photoresist film pattern as a mask; and removing the photoresist film pattern and etching the semiconductor substrate to a predetermined depth using the nitride film pattern as a mask.

3. The method of claim 1, wherein said conductive film is a p-poly silicon which is doped by one of the III group elements and has a thickness of 1000 Å.

4. The method of claim 1, wherein said conductive film is an n-poly silicon which is doped by one of the V group elements and has a thickness of 1000 Å.

5. The method of claim 1, wherein said conductive film is selectively and epitaxially grown by providing the semiconductor substrate having the trench formed thereon into a reactive container and providing HCL, DCS (Dichlorosilane, $SiH_2Cl_2$) as a silicon source and a diluted $B_2H_6$(Diborane) as a p-dopant thereinto.

6. The method of claim 1, wherein said trench is filled with a p-poly si oxide film that the conductive film (p-poly silicon film) is oxidized.

7. The method of claim 1, wherein said trench is filled with an n-poly si oxide film that the conductive film (n-poly silicon film) is oxidized.

* * * * *